United States Patent
Abys et al.

(10) Patent No.: US 6,267,863 B1
(45) Date of Patent: Jul. 31, 2001

(54) ELECTROPLATING SOLUTION FOR ELECTROPLATING LEAD AND LEAD/TIN ALLOYS

(75) Inventors: Joseph Anthony Abys, Warren; Kenneth J. Murski, West Milford; Yun Zhang, Warren, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/246,001

(22) Filed: Feb. 5, 1999

(51) Int. Cl.[7] ........................................ C25D 3/60
(52) U.S. Cl. ......................... 205/254; 205/253; 106/1.25
(58) Field of Search ........................... 205/254, 253, 205/252; 106/1.25

(56) References Cited

U.S. PATENT DOCUMENTS

| | | | |
|---|---|---|---|
| 4,263,106 | * 4/1981 | Kohl | 205/254 |
| 4,582,576 | * 4/1986 | Opaskar et al. | 205/254 |
| 4,662,999 | 5/1987 | Opaskar et al. | |
| 4,885,064 | 12/1989 | Bokisa et al. | |
| 4,994,155 | * 2/1991 | Toben et al. | 205/254 |
| 5,021,130 | 6/1991 | Metzger et al. | |

FOREIGN PATENT DOCUMENTS 0 825 281   2/1998   (EP) .

* cited by examiner

*Primary Examiner*—Kishor Mayekar
(74) *Attorney, Agent, or Firm*—Lowenstein Sandler PC

(57) ABSTRACT

An electroplating solution for plating bright tin, lead, or tin-lead alloy solder coatings in high speed electroplating applications. The electroplating solution includes an alkane or alkanol sulfonic acid electrolyte, a non-ionic surfactant, a grain refiner and two brightening agents: an aromatic aldehyde and a carboxylic acid. In one embodiment of the electroplating solution, the sulfonic acid electrolyte is methane sulfonic acid, the non-ionic surfactant is octylphenoxy (10)polyethoxy ethanol, the grain refiner is phenolphthalein, the aromatic aldehyde is chlorobenzaldehyde, and the carboxylic acid is methacrylic acid.

14 Claims, 5 Drawing Sheets

ELECTROPLATING SOLUTION FOR ELECTROPLATING LEAD AND LEAD/TIN ALLOYS

FIELD OF THE INVENTION

This invention relates to an aqueous electroplating solution for high speed electroplating bright tin and tin-lead alloy solder coatings, and in particular, to an electroplating solution having a simplified chemistry that minimizes the influence of organics in the solder coating.

BACKGROUND OF THE INVENTION

Electroplated tin and tin/lead alloy solder coatings are used extensively in the electronics industry in the manufacture of printed wiring boards (PWB), electrical contacts and connectors, semiconductor packaging, electrical conduits, and other related parts. These plated solder coatings must be pore free or corrosion resistant, display long tern solderability and be free from solderability failures such as non-wetting and dewetting.

Tin and tin/lead alloy solder coatings are typically deposited using high speed electroplating equipment in order to maximize productivity and hence, profitability. High speed electroplating is achieved with high current densities that tend to incorporate significant quantities of organics into the plated solder coatings. When these organic quantities become too large, solderability failures can occur.

Bright plated solder coatings produced in high speed electroplating processes using conventional electroplating solutions usually have undesirably large quantities of organics incorporated into them. This is because conventional electroplating solutions typically include many organic additives or agents which brighten the plated surfaces. These brightening agents produce electro-chemical and chemical by-products which are incorporated in the deposit during electroplating, thus increasing the organic content of the solder coating. During high speed electroplating, these by-products accumulate in the electroplating solution at a fast rate. The accumulation of these by-products in the electroplating solution increases the organic content of the solder coatings, thus leading to an unacceptable number of solderability failures. Therefore, in PWB and semiconductor packaging applications, such as leadframes, where solderability and productivity are very critical, plated solder coatings having matte or satin bright finishes are utilized because they can be produced in high speed electroplating processes with tolerable quantities of organics.

This is unfortunate because bright plated solder coatings have some distinct advantages over plated solder coatings with matte and satin bright finishes in certain areas other than solderability. On-line automatic inspection is easily implemented when bright plated solder coatings are used. Bright plated solder coatings are also less likely to have plating stains and are cosmetically superior.

Bright plated solder coatings with satisfactory solderability can only be achieved at low current densities with conventional electroplating solutions. The use of low current densities reduces the plating speed of the electroplating process. This in turn, significantly reduces productivity and thus, the profitability of the parts.

Accordingly, there is a need for an electroplating solution that produces bright plated solder coatings with low organic content at the high current densities employed in high speed electroplating processes.

SUMMARY OF THE INVENTION

In accordance with the present invention, an electroplating solution is provided for electroplating bright tin, lead, or tin-lead alloy solder coatings in high speed electroplating applications. The electroplating solution comprises a sulfonic acid electrolyte, a non-ionic surfactant, a grain refiner, and brightening agents consisting essentially of an aromatic aldehyde and a carboxylic acid.

In one embodiment of the electroplating solution, the sulfonic acid electrolyte, non-ionic surfactant, grain refiner, aromatic aldehyde, and carboxylic acid respectively comprise methane sulfonic acid, octylphenoxy(10)polyethoxy ethanol, phenolphthalein, chlorobenzaldehyde, and methacrylic acid.

BRIEF DESCRIPTION OF THE DRAWINGS

The advantageous nature and various additional features of the invention will appear more fully upon consideration of the illustrative embodiments now to be described in detail in connection with the accompanying drawings wherein.

DETAILED DESCRIPTION OF THE INVENTION

Figure 1:
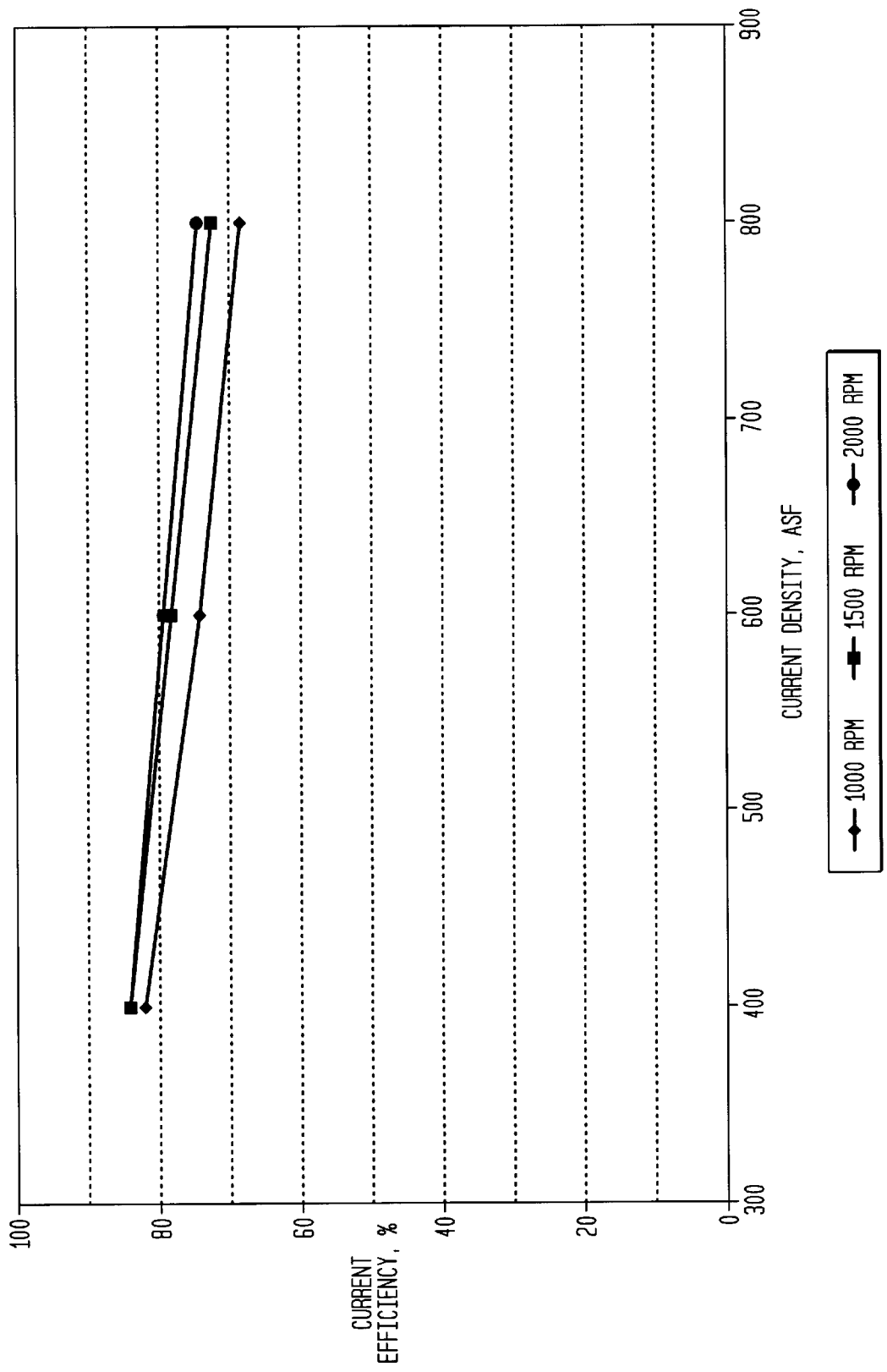
FIG. 1 is a graphical plot showing current efficiency vs. current density for an electroplating solution made according to the present invention.

The Table below illustrates how the organic content in plated solder coatings influences their solderability and reflowability. The satin plated solder coatings listed in the Table below were produced with conventional plating formulations that do not contain brighteners. These coatings have very low organic content which enable them to achieve excellent reflowability and solderability as evidenced by the thermal bake test results. However, these conventional plating formulations are not capable of producing bright plated solder coatings. This is unfortunate, as bright plated solder coatings provide some distinct advantages over plated solder coatings with satin bright finishes in terms of on-line automation and cosmetics as discussed earlier. If conventional brighteners are added to the satin bright plating formulations to obtain a bright formulation, the resulting bright plated solder coatings contain undesirable increases in organic content as shown in the Table. However, in the present invention, bright plated solder coatings are obtained without significantly elevating the organic content of the coating.

CARBON CONTENT vs. DEWETTING

| Finish | Carbon Content, % | Thermal Bake Test |
| --- | --- | --- |
| Satin bright tin (produced using conventional electroplating solution) | 0.004 | pass |

CARBON CONTENT vs. DEWETTING

| Finish | Carbon Content, % | Thermal Bake Test |
|---|---|---|
| Satin bright 90/10 tin/lead (produced using conventional electroplating solution) | 0.01 | pass |
| Bright 90/10 tin/lead (produced using electroplating solution of the present invention) | 0.02 | pass |
| Bright 90/10 tin/lead (produced using electroplating solution of the present invention with additional prior art brightening agent added) | 0.07 | dewetting no discoloration |
| Bright 90/10 tin/lead (produced using conventional electroplating solutions) | 0.1 | dewetting slight discoloration |
| Bright tin (produced using conventional electroplating solution) | 0.2 | dewetting severe discoloration |

Bright plated solder coatings are achieved in the present invention using a tin or tin/lead electroplating solution based upon an alkane or alkanol sulfonic acid electrolyte which includes certain brightening additives that interact synergistically during electroplating to produce bright tin or tin-lead alloy solder coatings having very low organic (carbon) content at current densities as high as 1300 ASF. As should be apparent, the low organic content in the bright plated solder coatings is advantageous in providing the coatings with excellent reflowability and solderability.

The very low organic content in bright plated solder coatings produced using the electroplating solution of the present invention makes them very useful in high speed continuous electroplating applications such as connectors, IC lead frames and other electronic components. The ability to achieve such low organic content at high current densities advantageously permits use of the electroplating solution in these high speed electroplating applications where high throughput and high productivity are possible.

The brightening additives used in the inventive electroplating solution consist of an aromatic aldehyde and a carboxylic acid. The aromatic aldehyde also functions as a leveling agent to improve the smoothness of the plated surface. The synergistic interaction of these two additives produces bright tin or tin-lead alloy solder coatings with very low organic content at relatively high current densities as shown in the above Table.

Some of the aromatic aldehydes which are useable in the electroplating solution include chlorobenzaldehyde, methoxybenzaldehyde, the allyl ether of 2-hydroxybenzaldehyde, and the derivatives of benzaldehyde which contain an electron donating group on the benzene ring. Some of the carboxylic acids which are useable in the electroplating solution of the invention include methacrylic acid, acrylic acid and their derivatives. In one embodiment, the aromatic aldehyde comprises chlorobenzaldehyde and the carboxylic acid comprises methacrylic acid.

To improve the dispersibility of the solution and suppress the growth of dendrites, a non-ionic surfactant and a grain refiner are added to the solution. The non-ionic surfactant improves the dispersibility of the solution and also ensures that the plated solder coatings adhere well to the underlying substrate. The grain refiner suppresses the growth of dendrites. Examples of suitable non-ionic surfactants include aromatic compounds such as substituted and unsubstituted phenyl and phenol compounds. Examples of suitable grain refiners include heterocyclic compounds such as substituted and unsubstituted lactones, cyclic imides, and oxazolines. In one embodiment, the non-ionic surfactant comprises a polyalkoxylated alkyl phenol, such as octylphenoxy(10) polyethoxy ethanol and the grain refiner comprises phenolphthalein.

The alkane or alkanol sulfonic acid electrolyte used in the solution should be water soluble or soluble in the solution. Suitable sulfonic acids include the lower alkane or alkanol sulfonic acids containing 1–5 carbon atoms. In one embodiment, the sulfonic acid electrolyte comprises methanesulfonic acid.

The tin and/or lead compounds typically used in the solution are those which are soluble in alkane or alkanol sulfonic acids and form an alkane or alkanol sulfonic acid salt. However, the tin and/or lead metals can be added to the baths in various forms and do not have to be added as a soluble alkane or alkanol sulfonate salt. Lead, for example, can be added as lead acetate. Thus, the solution can contain ions other than sulfonate ions as long as sufficient sulfonate ions are present to produce the advantageous results of the invention. The metals should predominate as sulfonates in the baths.

A solution for electroplating a tin-lead alloy is typically prepared by adding about 70–90 g/l of the stannous sulfonate and about 8–12 g/l of the lead sulfonate to about 175–225 ml of methanesulfonic acid. (A solution for electroplating either tin or lead can be prepared in the same manner by respectively omitting the lead or stannous sulfonate). To this solution are added about 2–2.5 g/l of octylphenoxy(10)polyethoxy ethanol, about 0.08–0.12 g/l of phenolphthalein, about 0.1–0.25 g/l of chlorobenzaldehyde and about 0.8–1.2 g/l of methacrylic acid.

After the solution is prepared, it can then be used in a high speed electroplating process for electroplating tin-lead alloy onto a metal substrate by placing the metal substrate in a electroplating solution equipped with a conventional electrode used to plate tin or tin-lead alloy onto a metal substrate. The electroplating solution is maintained at a temperature in the range of about 50° C. to about 60° C. The current densities used for electroplating are typically between about 300 and about 1300 ASF.

The substrate is maintained in the solution under the above conditions for a period of time that is sufficient to plate the substrate with a tin coating of a desired thickness. Typically, it is advantageous if the tin coating has a thickness of about 3 $\mu$m to about 6 $\mu$m.

EXAMPLE

A solution was prepared by adding 80 grams of stannous methane sulfonate and 10 grams of lead methyl sulfonate to one liter of an aqueous solution containing 200 ml of a 70 percent methane sulfonic acid. To this solution was added about 2 g/l of octylphenoxy(10)polyethoxy ethanol (commercially available under the tradename Triton X-100® from Union Carbide), about 0.08 g/l of phenolphthalein (commercially available from Fisher Scientific Co,) about 0.25 g/l of chlorobenzaldehyde (available from Aldrich), and about 1 g/l of methacrylic acid (available from Aldrich). The resulting solution was then used to plate a layer of tin-lead alloy on a substrate of copper, copper alloy or steel.

FIG. 1 graphically depicts the current efficiency of the electroplating solution of the above example. As can be seen, the current efficiency was high at about 80% and remained substantially constant between current densities of about 400 and about 800 ASF.

Figure 2:
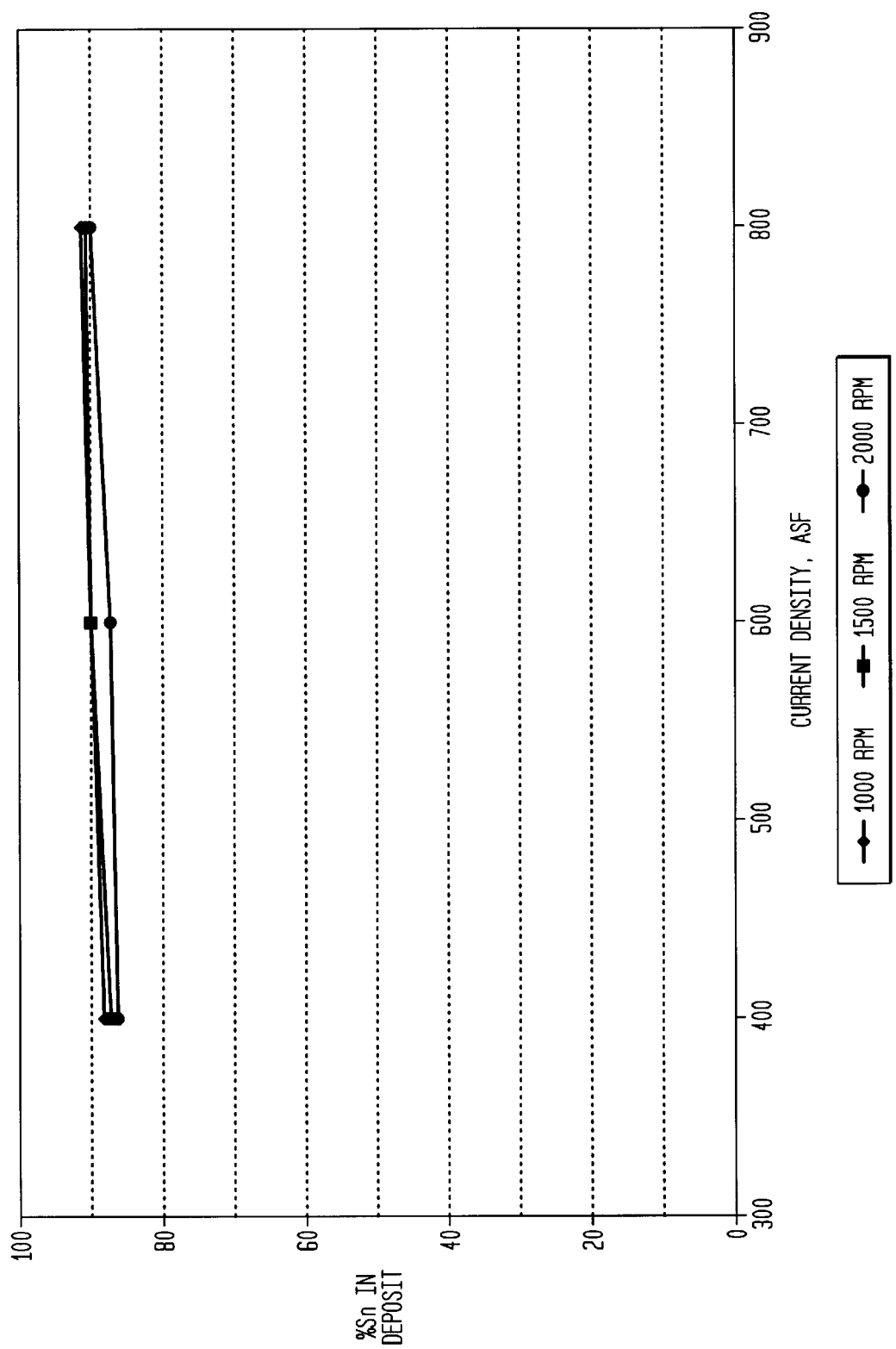
FIG. 2 is a graphical plot showing the percent tin in the coating vs. current density for a coating produced by the electroplating solution of the present invention.

FIG. 2 graphically shows that the alloy composition of the coating produced by the electroplating solution of the above example was stable over a wide operating range and was not sensitive to agitation. The carbon content in the coating was lower than 0.025%.

Figure 3:
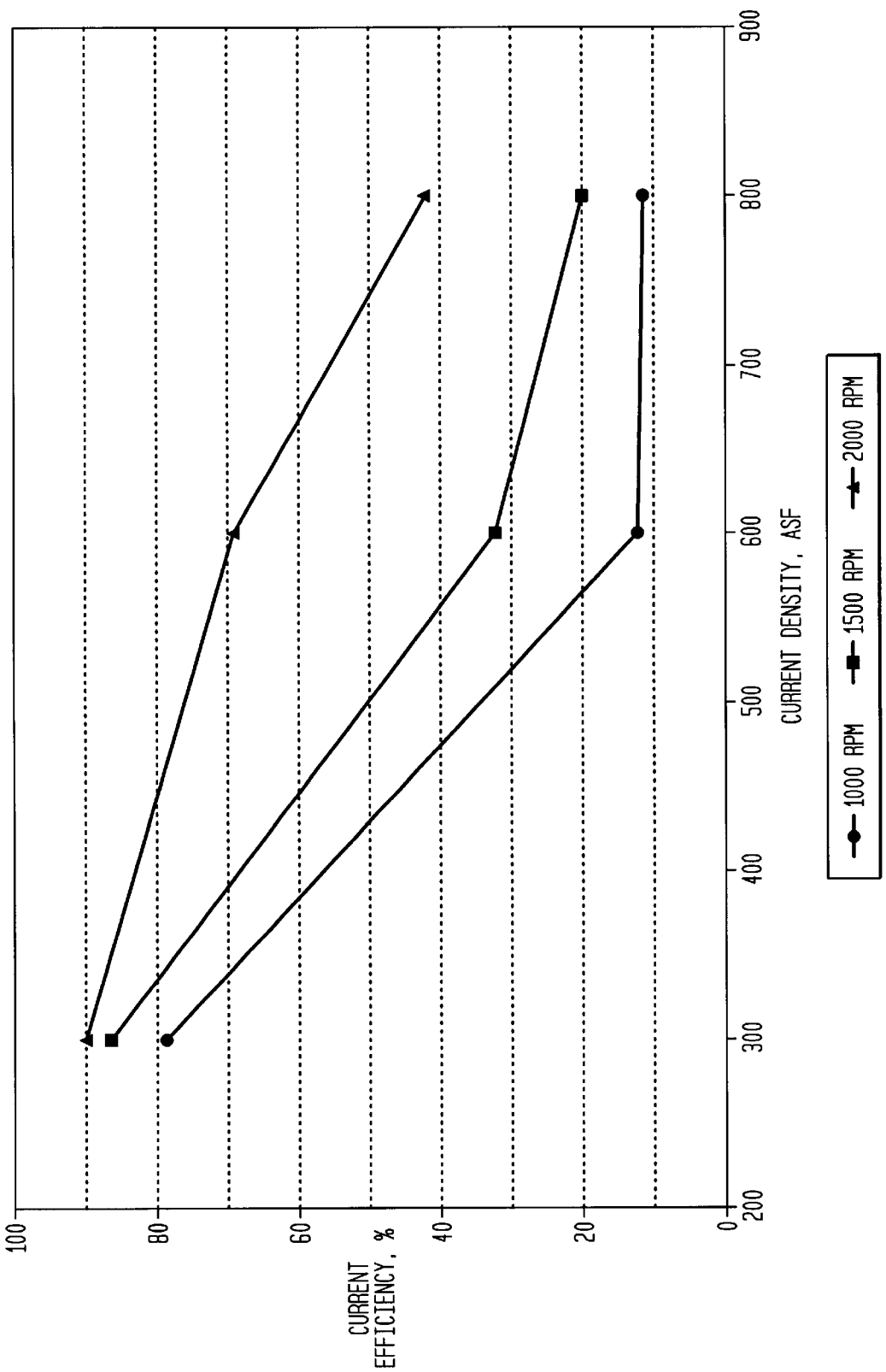
FIG. 3 is a graphical plot showing current efficiency vs. current density for a prior art electroplating solution.
Figure 4:
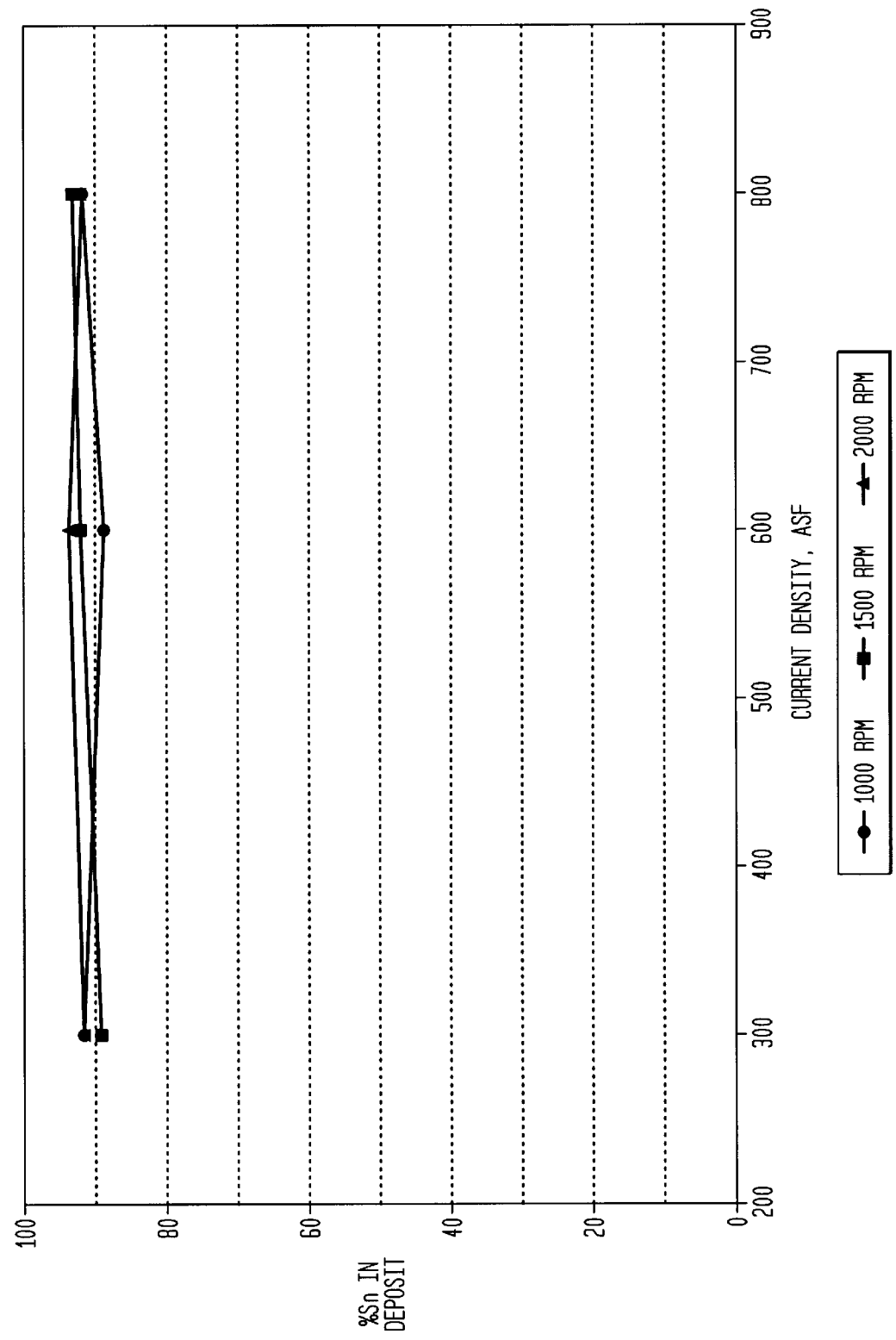
FIG. 4 is a graphical plot showing the percent tin in the coating vs. current density for a coating produced by a prior art electroplating solution.

FIG. 3 graphically shows the current efficiency of a typical conventional electroplating solution and FIG. 4 graphically shows the alloy composition of a coating produced by same. As can be seen, the conventional electroplating solution was not capable of plating well in the current density range that was used for electroplating with the solution of the present invention. Moreover, the coating produced by the conventional electroplating solution contained a much higher organic content (greater than 0.1%) as compared to the coating produced by the electroplating solution of the present invention.

Figure 5:
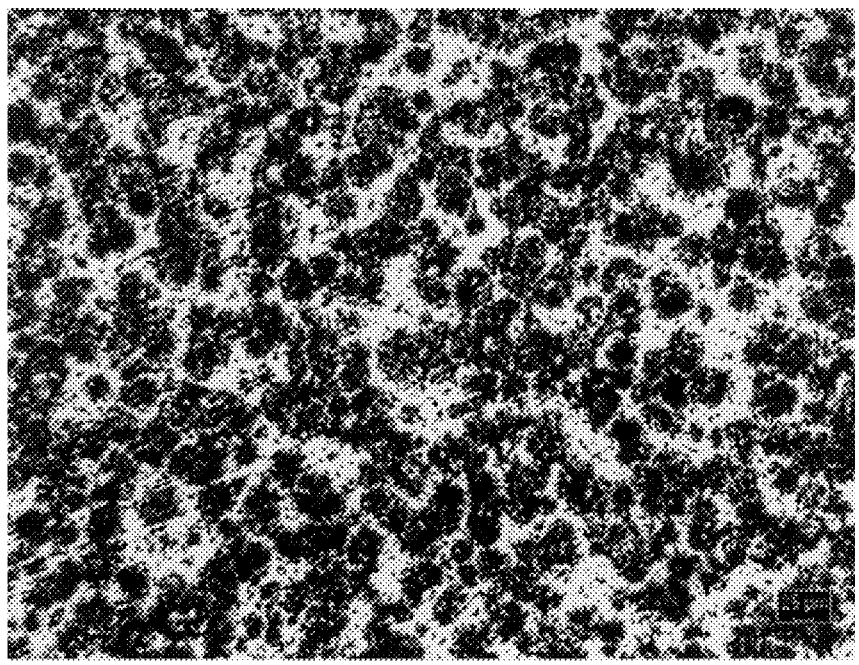
FIG. 5 is a SEM photograph of a bright tin-lead alloy solder coating produced by the electroplating solution of the present invention after thermal bake or reflow testing.
Figure 6:
FIG. 6 is a SEM photograph of a bright tin-lead alloy solder coating produced by a typical prior art electroplating solution after thermal bake or reflow testing.

The microstructures of the reflowed tin-lead alloy coatings produced by the electroplating solution of the present invention and a conventional bright electroplating solution are displayed in the optical photographs of FIGS. 5 and 6. The photographs were taken after subjecting the coatings to thermal bake or reflow tests. FIG. 5 illustrates the superior performance of the coating produced from the electroplating solution of the present invention when compared with FIG. 6. As can be discerned from FIGS. 5 and 6, there is no dewetting in FIG. 5 whereas there is a gross dewetting in FIG. 6. The dewetting phenomenon is exemplified by the "blisters" or "bubbles" seen on the coating surface. Dewetting can be detrimental because it weakens the interface between the substrate and the tin/lead layer. Peeling or adhesion problems are likely to be experienced by the parts. In this regard, the coating produced from the present invention is superior to the coating produced from the conventional bright plating solution.

While the foregoing invention has been described with reference to the above embodiments, various modifications and changes may be made without departing from the spirit of the present invention. Accordingly, modifications and changes such as those suggested above but not limited thereto are considered to be within the scope of the claims.

What is claimed is:

1. An electroplating solution useable for plating tin, lead, or tin-lead alloy solder coatings comprising:
   a sulfonic acid electrolyte;
   at least one of a tin sulfonate salt and a lead sulfonate salt;
   a non-ionic surfactant comprising an aromatic compound;
   a grain refiner comprising a heterocyclic compound; and
   brightening agents consisting essentially of an aromatic aldehyde and a carboxylic acid, wherein the surfactant, grain refiner and brightening agents are selected such that the electroplating solution is adapted for high speed plating of a bright solder coating having a carbon content of less than about 0.1%.

2. The electroplating solution of claim 1, wherein the aromatic compound is selected from the group consisting of substituted and unsubstituted phenyl and phenol compounds.

3. The electroplating solution of claim 1, wherein the aromatic compound is a polyalkoxylated alkyl phenol.

4. The electroplating solution of claim 1, wherein the aromatic compound is octylphenoxy(10)polyethoxy ethanol.

5. The electroplating solution of claim 1 wherein the heterocyclic compound is selected from the group of substituted and unsubstituted lactones, cyclic imides, and oxazolines.

6. The electroplating solution of claim 1, wherein the heterocyclic compound is phenolphthalein.

7. The electroplating solution of claim 1, wherein the aromatic aldehyde is selected from the group consisting of chlorobenzaldehyde, methoxybenzaldehyde, the allyl ether of 2-hydroxybenzaldehyde, and derivatives of benzaldehyde which contain an electron donating group on the benzene ring.

8. The electroplating solution of claim 1, wherein the aromatic aldehyde is chlorobenzaldehyde.

9. The electroplating solution of claim 1, wherein the carboxylic acid is selected from the group consisting of methacrylic acid, acrylic acid, and their derivatives.

10. The electroplating solution of claim 1, wherein the carboxylic acid is methacrylic acid.

11. The electroplating solution of claim 1, wherein the sulfonic acid electrolyte is selected from the group consisting of alkane sulfonate and alkanol sulfonate.

12. The electroplating solution of claim 1, wherein the at least one of a tin sulfonate salt and a lead sulfonate salt comprises a tin sulfonate salt and a lead sulfonate salt.

13. A process for electroplating a substrate with tin, lead, or tin-lead alloys comprising the steps of
   providing an electroplating solution comprising a sulfonic acid electrolyte; at least one of a tin sulfonate salt and a lead sulfonate salt; a non-ionic surfactant comprising an aromatic compound; a grain refiner comprising a heterocyclic compound; and brightening agents consisting essentially of an aromatic aldehyde and a carboxylic acid,
   positioning the substrate in the electroplating solution;
   applying current densities at greater than about 300 ASF; and
   maintaining the temperature of the electroplating solution at a sufficiently high temperature so that the substrate is electroplated with a bright solder coating have a carbon content of less than about 0.1%.

14. The process of claim 13, wherein the non-ionic surfactant comprises octylphenoxy(10)polyethoxy ethanol; the grain refiner comprises phenolphthalein; and the brighteners consist essentially of chlorobenzaldehyde and methacrylic acid, so that the current densities are greater than about 300 ASF, and wherein the temperature is maintained at above about 50 degrees C so that the substrate is electroplated with a bright solder coating have a carbon content of less than about 0.07%.

* * * * *